United States Patent
Halbert et al.

(10) Patent No.: US 6,317,352 B1
(45) Date of Patent: Nov. 13, 2001

(54) APPARATUS FOR IMPLEMENTING A BUFFERED DAISY CHAIN CONNECTION BETWEEN A MEMORY CONTROLLER AND MEMORY MODULES

(75) Inventors: John B. Halbert, Beaverton, OR (US); Jim M. Dodd, Shingle Springs; Chung Lam, Redwood Shores, both of CA (US); Randy M. Bonella, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/665,196

(22) Filed: Sep. 18, 2000

(51) Int. Cl.$^7$ .................................................. G11C 5/02
(52) U.S. Cl. ................................ 365/52; 365/51; 365/63; 365/230.05
(58) Field of Search ................................ 365/52, 230.05, 365/51, 63

(56) References Cited

U.S. PATENT DOCUMENTS 5,680,342 * 10/1997 Frankeny ................................ 365/52
6,137,709 * 10/2000 Boaz et al. ................................ 365/51
6,148,363 * 11/2000 Lofgren et al. ........................... 711/103

\* cited by examiner

*Primary Examiner*—David Nelms
*Assistant Examiner*—Connie C. Yoha
(74) *Attorney, Agent, or Firm*—Blakely, Sokoloff, Taylor & Zafman LLP

(57) ABSTRACT

A plurality of memory modules interface through a daisy-chain providing a point-to-point connection for each memory module. The first and the last memory module in the daisy chain each connect to a separate memory controller port forming a ring circuit. A distinct set of signals connect the memory modules in each direction. A junction circuit in each memory module provides line isolation, a coupling to the adjoining memory modules in the daisy chain, or in the case of the first and last memory module in the daisy chain, a memory module and a memory controller, and a data synchronization circuit. Each junction circuit provides as well as voltage conversion so that the memory devices on a memory module operate at a different voltage than the memory controller, and multiplexing/de-multiplexing so that a lesser number of lines interface with each junction circuit.

10 Claims, 5 Drawing Sheets

APPARATUS FOR IMPLEMENTING A BUFFERED DAISY CHAIN CONNECTION BETWEEN A MEMORY CONTROLLER AND MEMORY MODULES

FIELD OF THE INVENTION

The present invention relates to memory systems in computer systems. More specifically, the present invention relates to an apparatus for implementing a buffered daisy chain connection between a memory controller and memory modules.

BACKGROUND OF THE INVENTION

Memory modules such as the Dual In-Line Memory Module (DIMM) have become a popular memory packaging design. DIMMs are small printed circuit boards mounted with a plurality of memory devices. DIMMs have leads accessible via both sides of a printed circuit board's electrical connector unlike its predecessor, the Single In-Line Memory Module (SIMM), which has leads on only one side of the printed circuit board's electrical connector. DIMMs are inserted into small socket connectors that are soldered onto a larger printed circuit board, or motherboard. A plural number of memory modules are usually typically directly connected to a memory controller via multi-drop connections to a memory bus that is coupled to the memory side of the memory controller. The memory controller transmits and receives memory data via the memory bus. Each of the memory modules includes a plurality of memory devices mounted on the memory module. The memory devices typically are Dynamic Random Access Memory (DRAM).

FIG. 3 illustrates an end on view of a conventional multi-drop routing between a memory controller 111 and two exemplary memory modules 210–211. The memory bus 310 connects to each of the memory devices 210a and 210b through a stub. Stub 310a connects the bus 310 to memory devices 310a. Stub 310b connects the bus 310 to memory devices 211b. The stub introduces a capacitive load discontinuities to the signal being carried to the memory devices 211a and 211b by the bus 310. Furthermore, the stubs directly connect to the memory devices without any intermediary signal conditioning including a voltage translation. A drawback to memory modules directly connected to a memory bus via multi-drop connections is that there is no voltage level isolation between the memory devices and the memory controller. This lack of voltage isolation does not permit a variance between the voltage level of memory device inputs and memory controller outputs on the one hand, and memory device outputs and memory controller inputs on the other hand. Thus, in a system in which the signal level of a memory controller is below the memory device permissible range, the memory device will not recognize inputs, and memory device outputs will exceed the safe operating level of the memory controller or a coupled CPU.

Another drawback to memory modules directly connecting to a memory bus via multi-drop connections is that there is no capacitive load isolation between the multi-drop bus and the memory devices causing memory device operation that is slower than it would be without the multi-drop line capacitive load.

Another drawback to memory modules coupled to a memory bus via multi-drop connections is that the peak data rate per line on the memory bus is smaller than it would otherwise be because the discontinuities on a multi-point bus have an impedance that increases with frequency. This lower peak data rate per line places a higher floor on the number of pins connecting to a memory module for a given signal that would otherwise be for a point-to-point connection.

SUMMARY

According to an embodiment, a memory module includes a memory device and a junction circuit. The junction circuit has a first port to couple to a bus, a second port to coupled to the memory devices, a third port to couple to a second memory module, to send data received from the first port to both the second port and the third port, to send data received from the second port to the first port, and to send data received from the third port to the first port. The junction circuit includes an isolation circuit to provide a point-to-point connection to the first port and the third port.

BRIEF DESCRIPTION OF THE DRAWINGS

The present invention is illustrated by way of example and not by way of limitation in the figures of the accompanying drawings in which.

DETAILED DESCRIPTION

Figure 1:
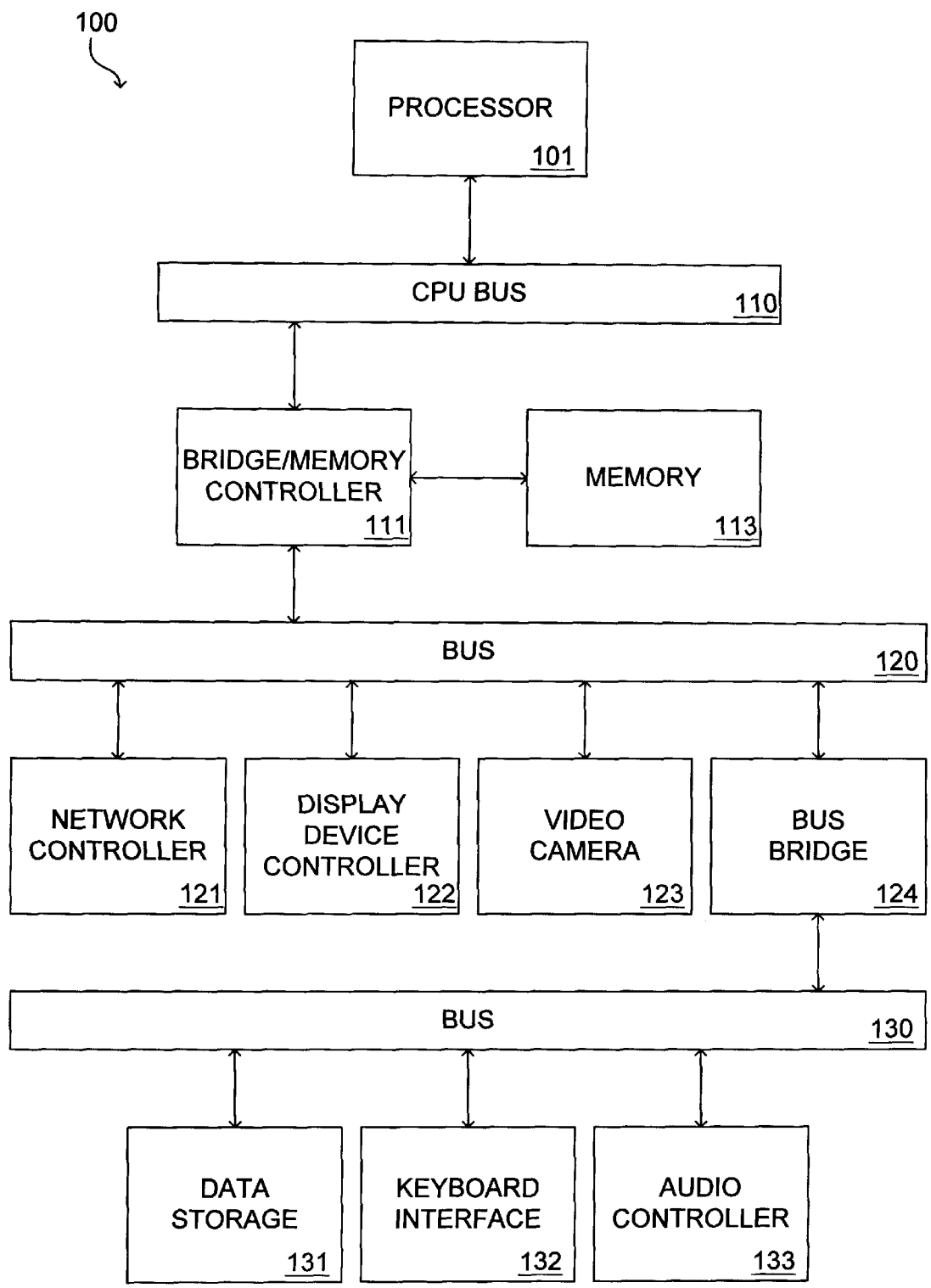
FIG. 1 is a block diagram of a computer system implementing an embodiment of the present invention.

FIG. 1 illustrates a computer system 100 upon which an embodiment of the present invention can be implemented. Referring to FIG. 1, the computer system 100 includes a processor 101 that processes data signals. The processor 101 may be a complex instruction set computer (CISC) microprocessor, a reduced instruction set computing (RISC) microprocessor, a very long instruction word (VLIW) microprocessor, a processor implementing a combination of instruction sets, or other processor device. FIG. 1 shows an example of the present invention implemented on a single processor computer system 100. However, it is understood that the present invention may be implemented in a computer system having multiple processors. The processor 101 is coupled to a central processing unit CPU bus 110 that transmits data signals between processor 101 and other components in the computer system 100.

The memory system 113 may include a dynamic random access memory (DRAM) device, a synchronous direct random access memory (SDRAM) device, a double data rate (DDR) SDRAM, a quad data rate (QDR) SDRAM or other memory device (not shown). The memory system 113 may store instructions and code represented by data signals that may be executed by the processor 101. According to an embodiment of the computer system 100, the memory system 113 comprises a plurality of memory modules 210–212 (portrayed in FIG. 2), portrayed as an exemplary three memory modules. Each printed circuit board generally operates as a daughter card insertable into a socket connector that is connected to the computer system 100.

A bridge memory controller 111 is coupled to the CPU bus 110 and the memory 113. The bridge memory controller 111 directs data signals between the processor 101, the memory system 113, and other components in the computer system 100 and bridges the data signals between the CPU bus 110, the memory system 113, and a first I/O bus 120. The processor 101, CPU bus 110, bridge/memory controller 111, and memory system 113 are together generally mounted on a common motherboard and are collectively referred to as the computer chipset 200 portrayed with reference to FIG. 2.

The first I/O bus 120 may be a single bus or a combination of multiple buses. As an example, the first I/O bus 120 may comprise a Peripheral Component Interconnect (PCI) bus, a Personal Computer Memory Card International Association (PCMCIA) bus, a NuBus, or other buses. The first I/O bus 120 provides communication links between components in the computer system 100. A network controller 121 is coupled to the first I/O bus 120. The network controller 121 links the computer system 100 to a network of computers (not shown in FIG. 1) and supports communication among the machines. A display device controller 122 is coupled to the first I/O bus 120. The display device controller 122 allows coupling of a display device (not shown) to the computer system 100 and acts as an interface between the display device and the computer system 100. The display device controller 122 may be a monochrome display adapter (MDA) card, a color graphics adapter (CGA) card, an enhanced graphics adapter (EGA) card, an extended graphics array (XGA) card or other display device controller. The display device may be a television set, a computer monitor, a flat panel display or other display device. The display device receives data signals from the processor 101 through the display device controller 122 and displays the information and data signals to the user of the computer system 100. A video camera 123 is coupled to the first I/O bus 120.

A second I/O bus 130 may be a single bus or a combination of multiple buses. As an example, the second I/O bus 130 may comprise a PCI bus, a PCMCIA bus, a NuBus, an Industry Standard Architecture (ISA) bus, or other buses. The second I/O bus 130 provides communication links between components in the computer system 100. A data storage device 131 is coupled to the second I/O bus 130. The data storage device 131 may be a hard disk drive, a floppy disk drive, a CD-ROM device, a flash memory device or other mass storage device. A keyboard interface 132 is coupled to the second I/O bus 130. The keyboard interface 132 may be a keyboard controller or other keyboard interface. The keyboard interface 132 may be a dedicated device or can reside in another device such as a bus controller or other controller. The keyboard interface 132 allows coupling of a keyboard (not shown) to the computer system 100 and transmits data signals from a keyboard to the computer system 100. An audio controller 133 is coupled to the second I/O bus 130. The audio controller 133 operates to coordinate the recording and playing of sounds is also coupled to the I/O bus 130. A bus bridge 124 couples the first I/O bus 120 to the second I/O bus 130. The bus bridge 124 operates to buffer and bridge data signals between the first I/O bus 120 and the second I/O bus 130.

Figure 2:
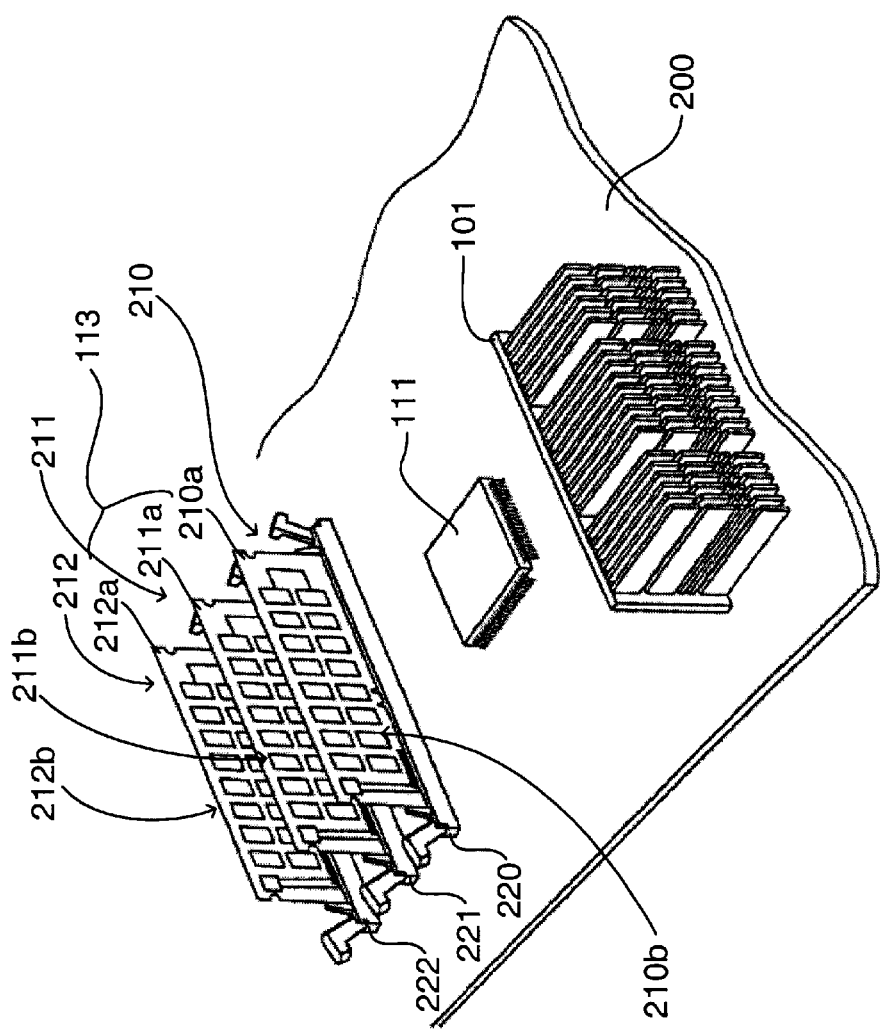
FIG. 2 illustrates a memory system mounted on a motherboard according to an embodiment of the present invention.

FIG. 2 illustrates a memory system 113 according to an embodiment of the present invention. Referring to FIG. 2 the memory system 113 generally resides on a motherboard 200 of the computer system 100. The motherboard 200 is a printed circuit board that interconnects components of the computer system 100 such as the bridge memory controller 111, the processor 101 and other components. The memory system 113 includes a plurality of memory modules 210–212. Each of the memory modules 210–212 comprises a printed circuit board 210a–212a mounting a plurality of memory devices 210b–212b. The memory system also generally includes a plurality of socket connectors 220–222 mounted on the motherboard 200. The memory modules 210–212 are insertable into the socket connectors 220–222. Electrical connectors on the memory module interface with electrical contacts in the socket connector. The electrical connectors and the electrical contacts allow components on the motherboard 200 to access the memory devices on the memory module. It should be appreciated that any number of socket connectors may be mounted on the motherboard to receive any number of memory modules. It should also be appreciated that any number of memory devices may be mounted on each memory module. The memory system 113 may be implemented in a computer system which partitions I/O structures differently than the one illustrated in FIG. 1.

Figure 4:
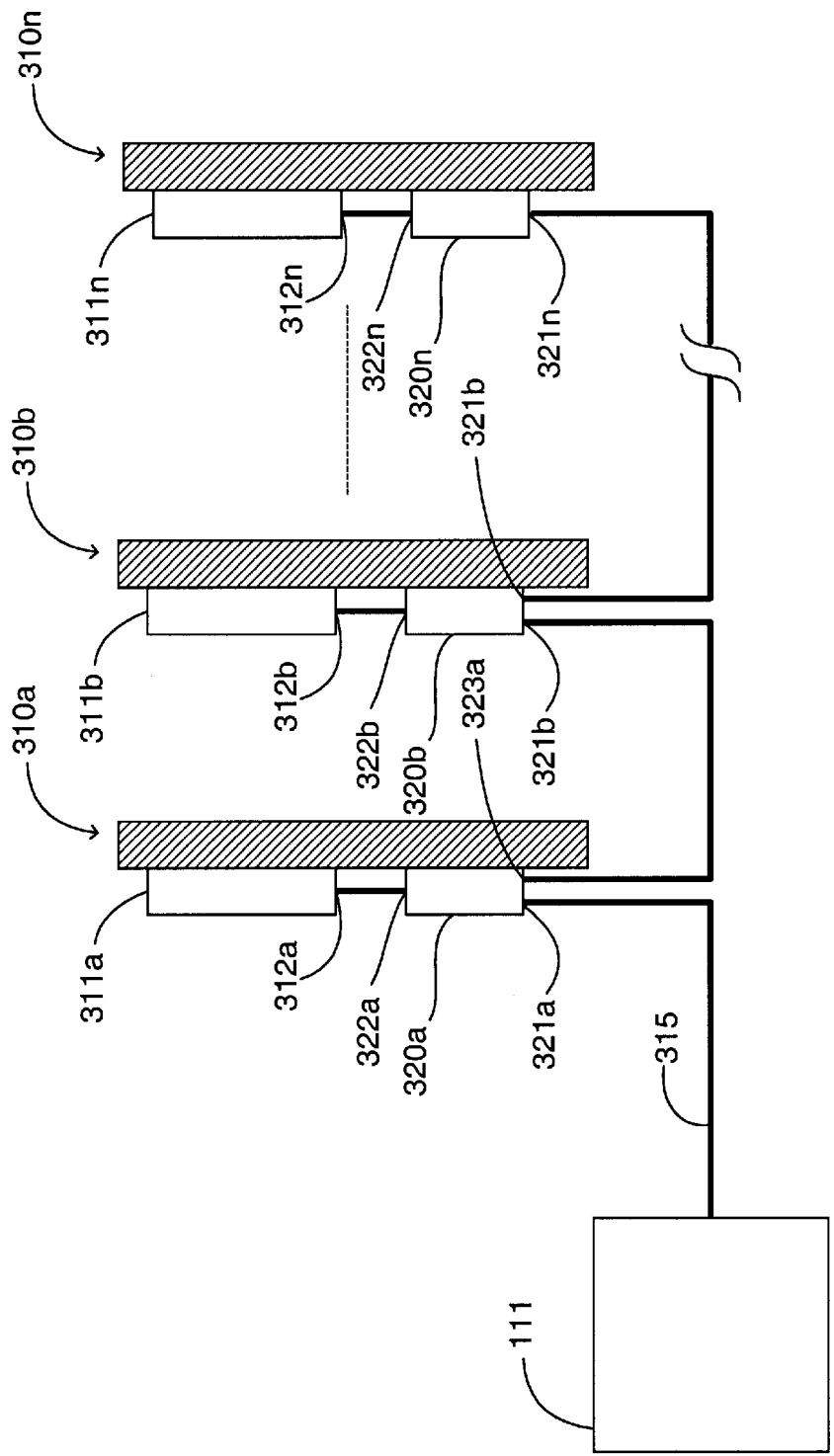
FIG. 4 illustrates a bus routing and wiring topology for a memory system according to an embodiment of the present invention.

FIG. 4 illustrates a bus routing and topology for the present invention for an embodiment having more than one memory modules, here portrayed as daisy-chained memory module 310a, 310b, . . . , 310n, where n can be any number greater than 1 (and where when n is 2, memory module 310b has the topological and routing characteristics of memory module 310n. A memory controller 111 is coupled to a bus 315 that includes at least one of memory-data signals and non-memory data signals, wherein the non-memory data signals may include at least one of address lines, command lines, and clock lines.

The memory module 310a includes the junction circuit 320a, also referred to as a buffer. The bus 315 is coupled to a first port 321a of a junction circuit 320a. The junction circuit 320a is coupled to memory devices 311a by a bus from port 322a of junction circuit 320a to port 312a of the memory devices 311a, wherein the device 311a is representative of each of the separate memory devices that populate the memory module 310a. The junction circuit 320a is further coupled by a bus 315a between a port 323a of the junction circuit 320a to a port 321b of the junction circuit 320b. The data input to the junction circuit 320a from bus 315 is routed by the junction circuit 320a to port 323a and transmitted through bus 315a to junction circuit 320b. The data input to the junction circuit 320a on port 323a from the junction circuit 320b is routed through port 321a to the bus 315.

The memory module 310b includes the junction circuit 320b. The junction circuit 320b is coupled by a bus from a port 322b to the memory devices 311b, wherein the device 311b is representative of each of the separate memory devices that populate the memory module 310b. The data input to the junction circuit 320b at port 321b from junction circuit 320a is routed by the junction circuit 320b to port 323b and transmitted via bus 315b to junction circuit 320n at port 321n. The data input to the junction circuit 320b from junction circuit 320n on bus 315b is input and routed through port 321b to the bus 315a. The memory module 310n includes the junction circuit 320n. Port 322n of junction circuit 320n is connected to memory devices 311n via port 312n of memory devices 311n wherein the port 311n is representative of each of the separate memory devices that populate the memory module 310n. The data transmitted to and from junction circuit 320n is routed through bus 315b to and from the junction circuit 320b at port 323b.

Figure 5:
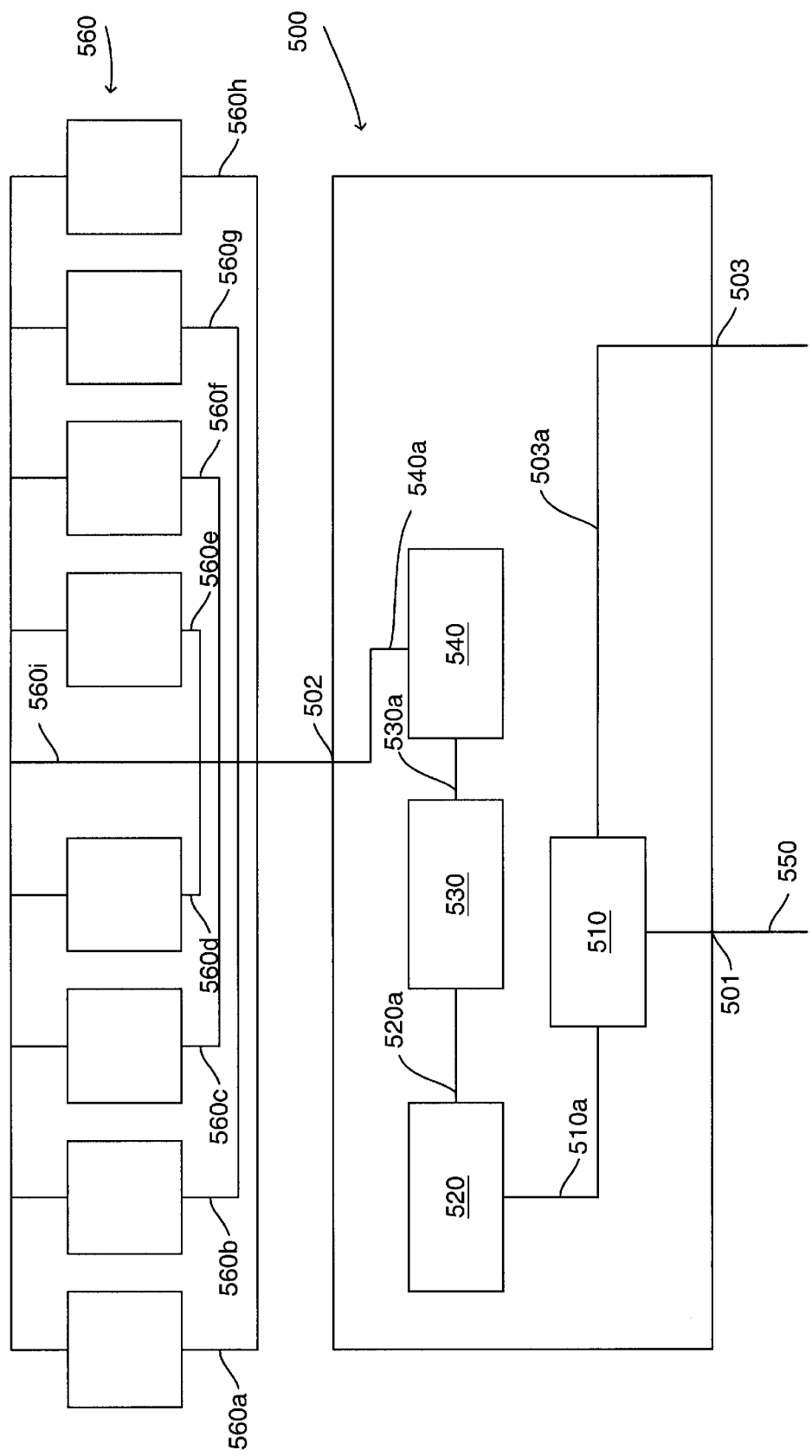
FIG. 5 illustrates a junction circuit according to an embodiment of the present invention.

FIG. 5 is a block diagram of a junction circuit 500 also referred to as a buffer according to an embodiment of the present invention. Referring to FIG. 5, it is understood that the junction circuit 500 includes other circuitry well known in the art such as signal regeneration circuitry and signal synchronization circuitry. Each of blocks 510, 520, and 530 represents a separate circuit function of the present invention. However, it is understood that more than one function can be performed by the same circuit elements, such as a voltage translation circuit can also provide a capacitive isolation to a signal line. Moreover, it is understood that the sequence of process functions represented by the blocks 510, 520, and 530 may be varied.

It is understood that because block 520 represents a voltage translation circuit that includes both a voltage raising function and a voltage lowering function, the voltage raising circuitry and the voltage lowering circuit include separate circuitry that can each be coupled in different positions in the data path. Moreover it is understood that because block 530 represents a multiplexing/de-multiplexing function that includes both a multiplexing function and a de-multiplexing function, the multiplexing circuit and the de-multiplexing circuit include separate circuitry that can each be coupled in different positions in the data path.

It is preferred that the de-multiplexing function represented by multiplexing/de-multiplexing block 530 be performed after the voltage translation function represented by block 520, and that the multiplexing function represented by block 530 be performed before the voltage translation function represented by block 520. This is because the de-multiplexing functions translates an input signal on a given number of lines into an output signal on a greater number of lines, and the multiplexing function translates an input signal on a given number of lines into an output signal on a lesser number of lines. Thus, by de-multiplexing after the voltage translation results in a smaller number of circuits to perform the voltage translation function, and by multiplexing before the voltage translation results in a smaller number of circuits to perform the voltage translation function.

Moreover the voltage translation function represented by block 520 to raise the data signal to a level in accordance with the requirements of memory devices can be performed on the data signal carried by bus 503a by performing the voltage raising function represented by block 520 on the data signal before it is ported out to bus 503a, then the voltage of the data signal carried by bus 503a must then be lowered by the voltage translation function represented by block 520 by placement of voltage lowering circuitry in the bus 503a data path. It is preferred that the voltage translation circuit represented by block 520 not be performed on the data signal carried by bus 503a.

Figure 3:
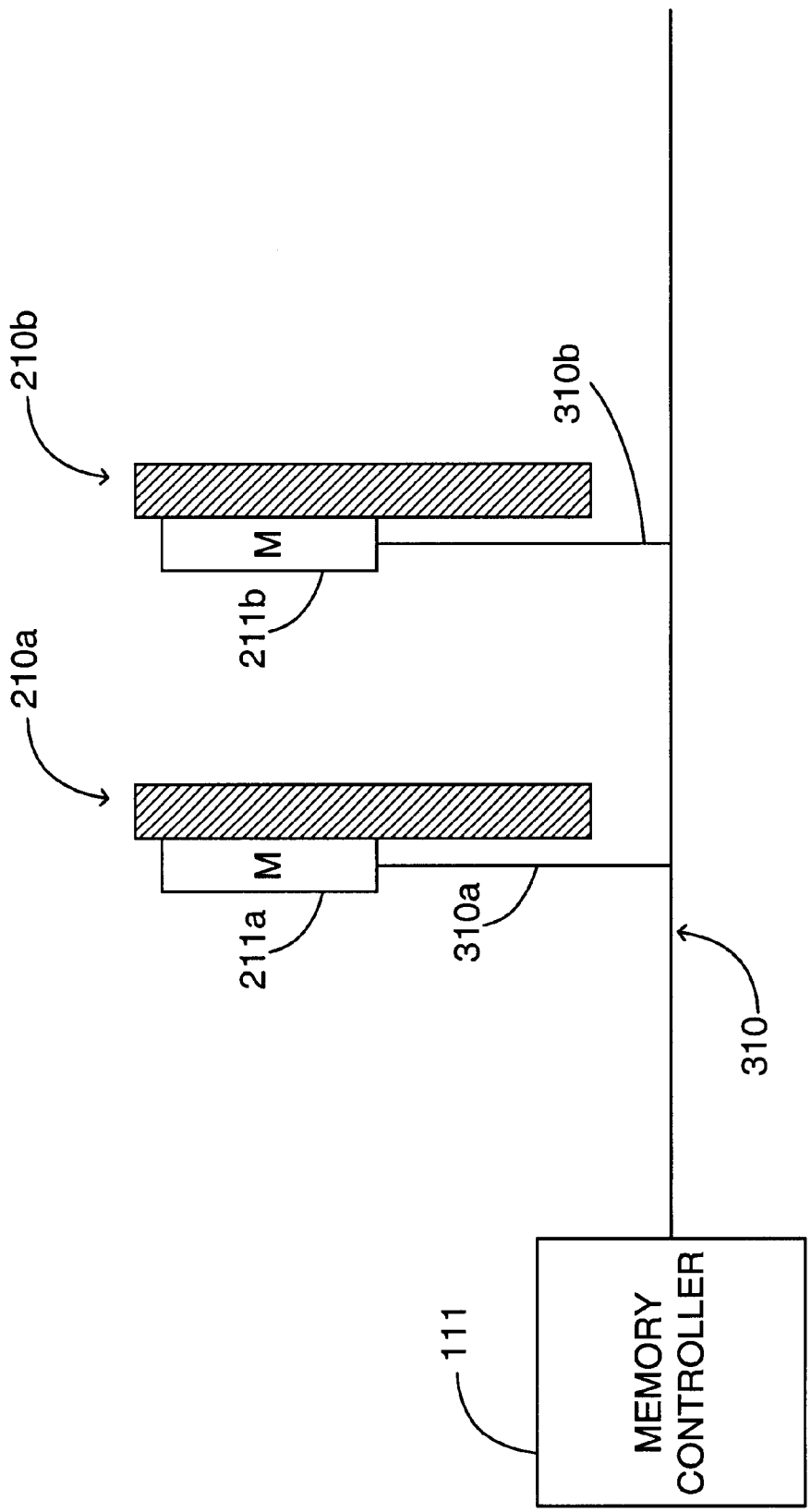
FIG. 3 illustrates an end on view of a conventional multi-drop routing between a memory controller and two exemplary memory modules.

A memory bus 550 couples to the junction circuit 500 at port 501. The memory bus 550 includes a plurality of lines. The preferred implementation includes both memory-data lines and non-memory data lines that may include addressing lines, command lines, and clock lines, and that shall be referred to hereafter as ADD/CMD lines. The lines are coupled to a capacitive isolation circuit represented by block 510 to isolate the junction circuit 500 from the input bus 550, resulting in a point to point connection between the junction circuit 500 and the transceiver/receiver (not shown) coupled to the other end of bus 550, rather than the conventional multi-drop configuration for a circuit having a plurality of memory modules as portrayed with reference to FIG. 3. The data transmitted to the junction circuit 500 from the bus 570 is routed to bus 503a and transmitted on bus 570 to a port 501 of a daisy-chained junction circuit. The data from the daisy-chained junction circuit is received by junction circuit 500 on bus 570 at port 503, and routed to the port 501 to the bus 550. In the daisy chain configuration portrayed in FIG. 4, the transceiver/receiver is a memory controller 111 for junction circuit 320a, and another junction circuit for junction circuit 320a+1 to junction circuit 320n. The capacitive isolation circuit provides a termination for the bus 550 and allows the bus 550 to achieve much higher frequencies due to very limited impedance discontinuities on the bus 550. Impedance discontinuities cause reflections in the waveform limiting the maximum frequency on the bus 550. With lower discontinuities on the bus, the frequency of the bus can be increased to a much higher rate over existing multi-drop memory buses. Also, given that the junction circuit 500 buffering contains all of the high speed interface, the memory devices 560 are freed of the burden of having the high speed logic and can be made less expensively. The isolation circuit 510 is coupled to both a voltage translation circuit 520 via bus 510a, and an output port 503 via bus 503a. In the case of a junction circuit at the end of a line of daisy-chained junctions circuits as portrayed with reference to FIG. 4 in the case of junction circuit 320n, the junction circuit may not include a port 503 and a coupled bus 503a.

The bus 510a for the purpose of this embodiment transmits data to the voltage translation circuit 520 for the memory devices 560, and to the isolation circuit 510 from the memory devices 560. The voltage translation function 520 includes a voltage raising circuit to translate the voltage range of each separate signal input to the junction circuit from bus 550 (dependent upon the position of the de-multiplexing circuit) from a range commensurate with a transmission from a memory controller or CPU, to a range commensurate with an input to the memory devices 560. The voltage translation function 520 includes a voltage lowering circuit to translate the voltage range of each separate signal output from the memory devices (dependent upon the position of the multiplexing circuit) from a range commensurate with a transmission from a memory device, to a range commensurate with an input to a memory controller or a CPU.

The bus 520a for the purpose of this embodiment transmits data to the de-multiplexing circuit of the multiplexing/de-multiplexing function 530 from the voltage translation function 520 and from the multiplexing circuit of the multiplexing/de-multiplexing function 530 to the voltage translation function 520. The de-multiplexing circuit processes an input having n lines, and de-multiplexes the input so that the output has m lines, wherein n is less than m (where m and n can be expressed alternatively as p and q). Thus, the input bit rate on each line is decreased by a ratio of n/m to maintain the same bandwidth on the input side as on the output side of the de-multiplexer circuit. Thus, the present invention enables a smaller number of data lines input to the junction circuit 500 than the memory devices 560 require allowing a narrower connecting bus 550 and 570. This lowers the number of required pins on the memory module. Furthermore, the present invention enables a lower frequencies on the input bus 501, thus decreased the power lost to capacitive load. The bus 530a for the purpose of this embodiment transmits data from the junction circuit port 502 to the multiplexing circuit of the multiplexing/de-multiplexing function 530, and transmits data from the de-multiplexing circuit of the multiplexer/de-multiplexer function 530 to the junction circuit port 502. The multiplexing circuit processes an input having m lines, and de-multiplexes the input so that the output has n lines, wherein n is less than m. Thus, the output bit rate on each line is increased by a ratio of m/n to maintain the same bandwidth on the input side as on the output side of the multiplexer circuit. Thus, the present invention enables a smaller number of data lines input to the junction circuit 500 than the memory devices 560 require. This lowers the number of required pins on the memory module. Furthermore, the present invention enables a lower frequencies on the input bus 501, thus decreased the power lost to capacitive load.

From junction circuit port 502, data is input and output to the memory devices 560 over the individual buses 560*a*–560*h*, and ADD/CMD data is input to the memory devices over the bus 560*i*. It is specifically understood that the need to signal condition individual ADD/CMD lines, and to signal condition memory data lines is different because of the possible differing requirements with regard to voltage translation and multiplexing/de-multiplexing. Accordingly, it is specifically contemplated that different multiplexer, de-multiplexer, and voltage translation circuits will be used for each. Furthermore, different embodiments of the present invention may not apply the isolation functions, the voltage translation functions, or the multiplexing/de-multiplexing functions to both the memory-data and the ADD/CMD data. Additionally, an embodiment of the present invention may not include the CMD/ADD data being transmitted from a junction circuit 500 from a port 501, and accordingly will not require the isolation function, the voltage lowering function, and the multiplexing function to a return ADD/CMD signal. A preferred embodiment includes two physically separate memory-data processing circuits, each memory-data circuit coupled to an exclusive subset of the memory devices 560, and one physically separate ADD/CMD processing circuit, each circuit including according to the embodiment the voltage translation, the isolation, and the multiplexing/de-multiplexing circuits. The two separate memory data-circuits enabling a data line topology that is more straightforward than would be the case with a unitary device.

In the foregoing description, the invention is described with reference to specific exemplary embodiments thereof. It will, however, be evident that various modifications and changes may be made thereto without departing from the broader spirit and scope of the present invention as set forth in the appended claims. The specification and drawings are to be regarded in an illustrative rather than a restrictive sense.

What is claimed is:

1. A first memory module comprising:
   at least one memory device;
   a junction circuit having a first port to couple to a bus that includes data lines characterized by at least one of at least one memory-data line and at least one non-memory-data line; a second port coupled to the memory devices; a third port to couple to a second memory module; to send data received from the first port to both the second port and the third port, to send data received from the second port to the first port, and to send data received from the third port to the first port, and that includes an isolation circuit to provide a point-to-point connection to the first port and the third port.

2. The memory module defined in claim 1 wherein the junction circuit further includes a voltage translation circuit to raise the voltage of each line input on the first port and output on the second port from a voltage range commensurate with a transmission by a memory controller to a voltage range commensurate with the memory devices, and to lower the voltage of each line input on the second port and output on the first port from a voltage range commensurate with the memory devices to a voltage range commensurate with a reception by the memory controller, the voltage translation circuit being in electrical communication with the first port and the second port.

3. The memory module defined in claim 1 wherein the junction circuit further includes:
   a first voltage translation circuit to raise the voltage of each line input on the first port from a voltage range commensurate with a transmission by a memory controller to a voltage range commensurate with the memory devices, and to lower the voltage of each line input on the second port and output on the first port from a voltage range commensurate with the memory devices to a voltage range commensurate with a reception by the memory controller, the first voltage translation circuit being in electrical communication with the first port, the second port, and a second voltage translation circuit; and
   the second voltage translation circuit to lower the voltage of each line output on the third port from a voltage range commensurate with the memory devices to a voltage range commensurate with a transmission by the memory controller, the second voltage translation circuit being in electrical communication with the first voltage translation circuit and the third port.

4. The memory module defined in claim 1 wherein the junction circuit further includes:
   a de-multiplexer circuit in electrical communication with the first port and the second port to de-multiplex a signal input on the memory data lines to the first port having a first bandwidth transmitted on n input lines, each input line having a bit rate of m, to a data signal having the first bandwidth transmitted on n-prime lines having a bit rate of m-prime wherein n is less than n-prime and m is greater than m-prime; and
   a multiplexer circuit in electrical communication with the first port and the second port to de-multiplex a signal input on the memory-data lines to the second port having a first bandwidth transmitted on n-prime input lines, each input line having a bit rate of m-prime, to a data signal having the first bandwidth transmitted on n lines having a bit rate of m wherein n is less than n-prime and m is greater than m-prime.

5. The memory module defined in claim 1 wherein the junction circuit further includes:
   a de-multiplexer circuit in electrical communication with the first port and the second port to de-multiplex a signal input on the non-memory data lines to the first port having a first bandwidth transmitted on q input lines, each input line having a bit rate of p, to a data signal having the first bandwidth transmitted on q-prime lines having a bit rate of p-prime wherein q is less than q-prime and p is greater than p-prime; and
   a multiplexer circuit in electrical communication with the first port and the second port to de-multiplex a signal input on the non-memory-data lines to the second port having a first bandwidth transmitted on q-prime input lines, each input line having a bit rate of p-prime, to a data signal having the first bandwidth transmitted on q lines having a bit rate of p wherein q is less than q-prime and p is greater than p-prime.

6. A memory system comprising:
   (a) a first memory module that includes
      at least one first memory device;
      a junction circuit having a first port to couple to a bus that includes data lines characterized by at least one of at least one memory-data line and at least one non-memory-data line; a second port coupled to the first memory devices; a third port coupled to a second memory module; to send data received from the first port to both the second port and the third port, to send data received from the second port to the first port, and to send data received from the third port to the first port, and that includes an isolation circuit to provide a point-to-point connection to the first port and the third port; and (b) the second memory module that includes
at least one second memory device;
a second junction circuit having a fourth port coupled
via a bus to the third port, a fifth port coupled to the
second memory devices to send data received from
the fourth port to the fifth port and send data received
from the fifth port to the fourth port; and an isolation
circuit to provide a point-to-point connection to the
fourth port.

7. The memory system defined in claim 6 wherein:
(a) the first junction circuit further includes a first voltage translation circuit to raise the voltage of each line input on the first port and output on the second port from a voltage range commensurate with a transmission by a memory controller to a voltage range commensurate with the first memory devices, and to lower the voltage of each line input on the second port and output on the first port from a voltage range commensurate with the first memory devices to a voltage range commensurate with a reception by the memory controller, the first voltage translation circuit being in electrical communication with the first port and the second port; and
(b) the second junction circuit further includes a second voltage translation circuit to raise the voltage of each line input on the fourth port and output on the fifth port from a voltage range commensurate with a transmission by a memory controller to a voltage range commensurate with the second memory devices, and to lower the voltage of each line input on the fifth port and output on the fourth port from a voltage range commensurate with the second memory devices to a voltage range commensurate with a reception by the memory controller, the second voltage translation circuit being in electrical communication with the fourth port and the fifth port.

8. The memory module defined in claim 6 wherein the junction circuit further includes:
a first voltage translation circuit to raise the voltage of each line input on the first port from a voltage range commensurate with a transmission by a memory controller to a voltage range commensurate with the first memory devices, and to lower the voltage of each line input on the second port and output on the first port from a voltage range commensurate with the first memory devices to a voltage range commensurate with a reception by the memory controller, the voltage translation circuit being in electrical communication with the first port, the second port, and a second voltage translation circuit;
the second voltage translation circuit to lower the voltage of each line output on the third port from a voltage range commensurate with the first memory devices to a voltage range commensurate with a transmission by the memory controller, the voltage translation circuit being in electrical communication with the first voltage translation circuit and the third port; and
a third voltage translation circuit to raise the voltage of each line input on the fourth port from a voltage range commensurate with a transmission by a memory controller to a voltage range commensurate with the second memory devices, and to lower the voltage of each line input on the fifth port and output on the fourth port from a voltage range commensurate with the second memory devices to a voltage range commensurate with a reception by the memory controller, the third voltage translation circuit being in electrical communication with the fourth port and the fifth port.

9. The memory module defined in claim 6 wherein the first junction circuit further includes:
a de-multiplexer circuit in electrical communication with the first port and the second port to de-multiplex a signal input on the memory data lines to the first port having a first bandwidth transmitted on n input lines, each input line having a bit rate of m, to a data signal having the first bandwidth transmitted on n-prime lines having a bit rate of m-prime wherein n is less than n-prime and m is greater than m-prime; and
a multiplexer circuit in electrical communication with the first port and the second port to de-multiplex a signal input on the memory-data lines to the second port having a first bandwidth transmitted on n-prime input lines, each input line having a bit rate of m-prime, to a data signal having the first bandwidth transmitted on n lines having a bit rate of m wherein n is less than n-prime and m is greater than m-prime; and wherein the second junction circuit further includes
a de-multiplexer circuit in electrical communication with the fourth port and the fifth port to de-multiplex a signal input on the memory data lines to the fourth port having a first bandwidth transmitted on n input lines, each input line having a bit rate of m, to a data signal having the first bandwidth transmitted on n-prime lines having a bit rate of m-prime wherein n is less than n-prime and m is greater than m-prime; and
a multiplexer circuit in electrical communication with the fourth port and the fifth port to de-multiplex a signal input on the memory-data lines to the fifth port having a first bandwidth transmitted on n-prime input lines, each input line having a bit rate of m-prime, to a data signal having the first bandwidth transmitted on n lines having a bit rate of m wherein n is less than n-prime and m is greater than m-prime.

10. The memory module defined in claim 6 wherein the first junction circuit further includes:
a de-multiplexer circuit in electrical communication with the first port and the second port to de-multiplex a signal input on the non-memory data lines to the first port having a first bandwidth transmitted on q input lines, each input line having a bit rate of p, to a data signal having the first bandwidth transmitted on q-prime lines having a bit rate of p-prime wherein q is less than q-prime and p is greater than p-prime; and
a multiplexer circuit in electrical communication with the first port and the second port to de-multiplex a signal input on the non-memory-data lines to the second port having a first bandwidth transmitted on q-prime input lines, each input line having a bit rate of p-prime, to a data signal having the first bandwidth transmitted on q lines having a bit rate of p wherein q is less than q-prime and p is greater than p-prime; and the second junction circuit further includes
a de-multiplexer circuit in electrical communication with the fourth port and the fifth port to de-multiplex a signal input on the non-memory data lines to the fourth port having a first bandwidth transmitted on q input lines, each input line having a bit rate of p, to a data signal having the first bandwidth transmitted on q-prime lines having a bit rate of p-prime wherein q is less than q-prime and p is greater than p-prime; and
a multiplexer circuit in electrical communication with the fourth port and the fifth port to de-multiplex a signal input on the non-memory-data lines to the fifth port having a first bandwidth transmitted on q-prime input lines, each input line having a bit rate of p-prime, to a data signal having the first bandwidth transmitted on q lines having a bit rate of p wherein q is less than q-prime and p is greater than p-prime.

* * * * *